(12) United States Patent
Nishide et al.

(10) Patent No.: US 6,891,109 B2
(45) Date of Patent: May 10, 2005

(54) MONOLITHIC CERAMIC SUBSTRATE AND METHOD FOR MAKING THE SAME

(75) Inventors: Mitsuyoshi Nishide, Shiga-ken (JP); Ryoji Nakamura, Shiga-ken (JP); Norio Sakai, Moriyama (JP)

(73) Assignee: Murata Manufacturing Co., Ltd., Kyoto (JP)

(*) Notice: Subject to any disclaimer, the term of this patent is extended or adjusted under 35 U.S.C. 154(b) by 365 days.

(21) Appl. No.: 10/116,646

(22) Filed: Apr. 4, 2002

(65) Prior Publication Data

US 2002/0166694 A1 Nov. 14, 2002

(30) Foreign Application Priority Data

Apr. 4, 2001 (JP) ........................... 2001-106253
Jan. 9, 2002 (JP) ........................... 2002-002577

(51) Int. Cl.$^7$ ............................................. H05K 1/00
(52) U.S. Cl. ................. 174/258; 174/255; 361/795; 361/807
(58) Field of Search .................. 29/851; 361/792–795, 361/762, 771, 779, 807, 809; 174/258, 255–257, 259, 52.1

(56) References Cited

U.S. PATENT DOCUMENTS

| 5,102,720 | A | | 4/1992 | Raj | |
|---|---|---|---|---|---|
| 5,281,151 | A | * | 1/1994 | Arima et al. | 439/68 |
| 5,300,163 | A | * | 4/1994 | Ohtaki | 156/89.15 |
| 5,324,370 | A | * | 6/1994 | Aoki et al. | 156/64 |
| 5,382,757 | A | * | 1/1995 | Ishida | 174/262 |
| 5,601,672 | A | * | 2/1997 | Casey et al. | 156/89.16 |
| 5,858,145 | A | * | 1/1999 | Sreeram et al. | 156/89.16 |
| 6,241,838 | B1 | * | 6/2001 | Sakamoto et al. | 156/89.17 |
| 6,392,164 | B1 | * | 5/2002 | Iwaki et al. | 174/262 |

FOREIGN PATENT DOCUMENTS

| JP | 7-86743 | 3/1995 |
|---|---|---|
| JP | 8-204314 | 8/1996 |

* cited by examiner

*Primary Examiner*—Kamand Cuneo
*Assistant Examiner*—Jeremy Norris
(74) *Attorney, Agent, or Firm*—Keating & Bennett, LLP

(57) ABSTRACT

A monolithic ceramic substrate includes a green laminate having a plurality of green functional ceramic layers including a functional ceramic material, green support layers including a ceramic material that does not sinter at a sintering temperature for the green functional ceramic material to prevent shrinkage of the functional ceramic layers, first conductor patterns including a thin-film conductor, and second conductor patterns including a thick-film conductor. The green laminate is fired at the sintering temperature for the green functional ceramic material.

12 Claims, 2 Drawing Sheets

MONOLITHIC CERAMIC SUBSTRATE AND METHOD FOR MAKING THE SAME

BACKGROUND OF THE INVENTION

1. Field of the Invention

The present invention relates to a monolithic ceramic substrate manufactured by a process that does not cause shrinkage of the monolithic ceramic substrate and a method for making the monolithic ceramic substrate that does not shrink along the principal plane during sintering.

2. Description of the Related Art

As disclosed in Japanese Unexamined Patent Application Publication No. 7-86743, a monolithic ceramic substrate is manufactured by a process which does not cause shrinkage of the monolithic ceramic substrate. More specifically, a laminate including a plurality of ceramic layers made of glass ceramic that sinters at low temperatures is disposed between two inorganic constraining layers that do not sinter at a sintering temperature for the ceramic layers, this composite is sintered, and then the constraining layers are removed.

Conductor patterns are disposed at desired interfaces between the ceramic layers and the constraining layers and on outer surfaces of the laminate. These conductor patterns are formed by etching a metal foil that does not shrink at the sintering temperature for the ceramic layers.

This method, however, has the following problems. The thin-film conductor is a dense film. Thus, the thin-film conductor does not include interstices for releasing gas generated by decomposition of a binder component in the green ceramic sheets during sintering in a pattern having a large occupancy area, such as a ground electrode pattern. As a result, voids and residual carbon, which greatly reduce the reliability of the monolithic ceramic substrate, tend to remain in the vicinity of the thin-film conductors.

Since the thin-film conductor has low mechanical strength, the conductor must have an increased thickness. Thus, the thin-film conductor does not shrink during sintering, and as a result, the soft green ceramic sheets are compacted. The soft green ceramic sheets are dense at patterns having large occupancy areas but are not dense at patterns having small occupancy areas, for example, inductor electrodes and signal lines, resulting in a large difference in the density in the green ceramic sheet. As a result, the internal stress in a circuit board including many patterns having large occupancy areas is greatly increased, which causes deformation or cracking.

SUMMARY OF THE INVENTION

In order to overcome the above-described problems, preferred embodiments of the present invention provide a highly reliable monolithic ceramic substrate having a conductor pattern and a method for making the same.

According to a preferred embodiment of the present invention, a monolithic ceramic substrate includes a plurality of functional ceramic layers including a functional ceramic material, support layers including a ceramic material that does not sinter at a sintering temperature of the functional ceramic material, the support layers being in contact with the respective functional ceramic layers to suppress the shrinkage of the functional ceramic layers, first conductor patterns including at least one thin-film conductor selected from the group consisting of a metal foil, a metal wire, and a conductive thin-film, the first conductor patterns being in contact with the respective functional ceramic layers, and second conductor patterns including a thick-film conductor in contact with the respective functional ceramic layers.

Preferably, the support layers are each disposed between the two adjoining functional ceramic layers. In addition, the first conductor patterns and the second conductor patterns are preferably each disposed between one of the functional ceramic layers and one of the support layers.

The thin-film conductor defining the first conductor pattern preferably has a thickness of about 100 μm or less. It is also preferred that the thin-film conductor defining the first conductor pattern has a porosity of about 10% or less before sintering. The thin-film conductor defining the first conductor pattern preferably has a volume resistivity of about 2.5 Ω·cm or less and a surface roughness of about 5 μm or less. The area ratio of the thin-film conductor defining the first conductor pattern to the functional ceramic layer is preferably about 90% or less.

The second conductor patterns are preferably made of a conductive paste and have a thickness of about 30 μm or less after sintering of the functional ceramic layers.

It is also preferred that the first conductor patterns each define at least one of an inductor electrode and a signal line. In such a case, the area ratio of the thin-film conductor relative to the functional ceramic layer is preferably about 30% or less.

Preferably, the second conductor patterns each define a ground electrode. In such a case, the area of the second conductor pattern is preferably at least about 50% of the area of the functional ceramic layer.

According to another preferred embodiment of the present invention, a method for making a monolithic ceramic substrate includes the steps of preparing a green laminate having a plurality of green functional ceramic layers including a functional ceramic material, green support layers including a ceramic material that does not sinter at a sintering temperature for the green functional ceramic material, the green support layers being in contact with the respective green functional ceramic layers to prevent shrinkage of the functional ceramic layers, first conductor patterns including at least one thin-film conductor selected from the group consisting of a metal foil, a metal wire, and a conductive thin-film, the first conductor patterns being in contact with the respective green functional ceramic layers, and second conductor patterns including a thick-film conductor in contact with the respective green functional ceramic layers, and firing the green laminate at the sintering temperature of the green functional ceramic material.

Preferably, the green support layers are each disposed between the two adjoining green functional ceramic layers. It is also preferred that the first conductor patterns and the second conductor patterns are each disposed between one of the green functional ceramic layers and one of the support layers.

The thin-film conductor defining the first conductor pattern preferably has a thickness of about 100 μm or less. Preferably, the thin-film conductor defining the first conductor pattern has a porosity of about 10% or less before sintering. It is also preferred that the thin-film conductor defining the first conductor pattern has a volume resistivity of about 2.5 Ω·cm or less and a surface roughness of about 5 μm or less. Preferably, the area ratio of the thin-film conductor defining the first conductor pattern to the functional ceramic layer is about 90% or less. In addition, the second conductor patterns is preferably formed of a conductive paste and have a thickness of about 30 µm or less after sintering of the functional ceramic layers.

In the monolithic ceramic substrate and the method for making this substrate according to preferred embodiments of the present invention, different compositions are used for the first conductor patterns, such as inductors and signal lines, having small occupancy areas and the second conductive patterns, such as grounds and capacitors, having large occupancy areas. In a monolithic ceramic substrate including conductor patterns, the conductor patterns are highly precise due to the support layers which suppress shrinkage of the functional ceramic layers. Furthermore, the compositions for the first and second conductor patterns can be appropriately changed depending on the characteristics required for these conductor patterns. In particular, the monolithic ceramic substrate according to preferred embodiments of the present invention has excellent radiofrequency characteristics. Furthermore, in the monolithic ceramic substrate, the formation of voids and cracks in the ceramic layers and the conductor patterns is greatly reduced.

Other features, elements, characteristics and advantages of the present invention will become more apparent from the following detailed description of preferred embodiments thereof with reference to the attached drawings.

DETAILED DESCRIPTION OF PREFERRED EMBODIMENTS

Preferred embodiments of the present invention will now be described with reference to the attached drawings.

Figure 1:
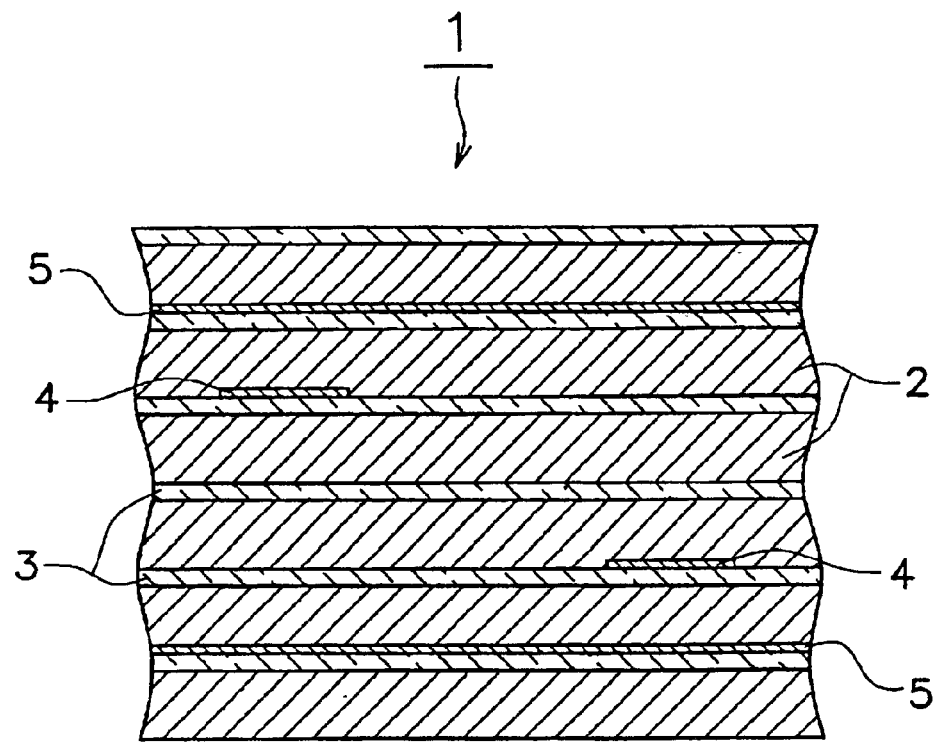
FIG. 1 is a cross-sectional view of a preferred embodiment of a monolithic ceramic substrate according to the present invention.

Referring to FIG. 1, a monolithic ceramic substrate 1 includes a plurality of functional ceramic layers 2 including a functional ceramic material. The functional ceramic material has a specific electrical property, for example, dielectricity, insulation, or magnetism. Thus, the material is selected depending upon a property required for the monolithic ceramic substrate 1. These functional ceramic layers 2 may be composed of the same functional ceramic material or may be composed of different functional ceramic materials. Preferably, the functional ceramic material sinters at low temperatures to sinter with low-resistance metals such as copper and silver. Thus, the functional ceramic material preferably includes crystallized glass or a mixture of glass and ceramic, or other suitable material.

The monolithic ceramic substrate 1 includes support layers 3 that prevent shrinkage of the functional ceramic layers 2. Each support layer 3 is in contact with the corresponding functional ceramic layer 2. In FIG. 1, all the functional ceramic layers 2 are in contact with the respective support layers 3 so that each support layer 3 is disposed between two adjoining functional ceramic layers 2.

The support layers 3 include a ceramic material that does not sinter at a sintering temperature for the functional ceramic material in the functional ceramic layers 2. Examples of the preferred ceramic materials include alumina and zirconia, or other suitable material.

Materials included in the functional ceramic layers 2, for example, glass, partially migrate into the support layers 3 during firing, and bond the ceramic materials included in the support layers 3 after the firing. In other words, the ceramic materials in the support layers 3 are bonded by glass that migrates from the functional ceramic layers. Thus, the functional ceramic layers provide a sufficient amount of ceramic materials to the support layers 3. Thus, the thickness of the functional ceramic layers is preferably at least about two times and more preferably at least about three times the thickness of the support layers 3.

The monolithic ceramic substrate 1 also includes first conductor patterns 4 and second conductor patterns 5. The first conductor patterns 4 and the second conductor patterns 5 are each in contact with a desired functional ceramic layer 2.

For conductor patterns having small occupancy areas with respect to the functional ceramic layer, for example, inductor electrodes or signal lines, the first conductor patterns 4 are defined by at least one of a conductive thin-film, a metal foil, and a metal wire, which are preferably made of copper, silver, or gold, or other suitable material. For conductor patterns having large occupancy areas such as ground electrodes, the second conductor patterns 5 are preferably defined by a thick-film conductor formed of a conductive paste containing a powdered conductive component, such as powdered copper, silver, and gold, and an organic vehicle composed of an organic binder and a solvent, or other suitable materials.

When the first conductor pattern defines an inductor electrode or a signal line, the area ratio of the first conductor pattern relative to the functional ceramic layer is preferably about 30% or less and more preferably about 20% or less. When the second conductor pattern defines a ground electrode, the area ratio of the second conductor pattern relative to the functional ceramic layer is preferably at least about 50% and more preferably at least about 70%. Preferably, the first conductor pattern and the second conductor pattern are provided on different layers, although these patterns may be provided on the same layer.

A method for making the monolithic ceramic substrate 1 and the results of an evaluation of the monolithic ceramic substrate produced by the method will now be described.

Figure 2A:
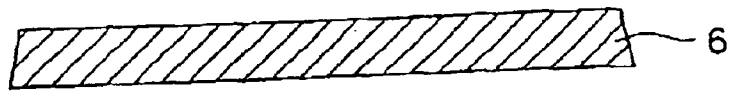
FIGS. 2A to 2G are cross-sectional views illustrating steps for making the monolithic ceramic substrate shown in FIG. 1.

Referring to FIG. 2A, a plurality of green functional ceramic sheets 6 including a functional ceramic material is provided. The functional ceramic material in this preferred embodiment is an insulating $BaO-Al_2O_3-SiO_2$ ceramic powder that sinters at low temperatures. In FIG. 2A, the green functional ceramic sheets 6 are illustrated as one sheet. In general, one functional ceramic layer 2 includes a laminate of the plurality of green functional ceramic sheets 6 so as to have a required thickness.

Figure 2B:
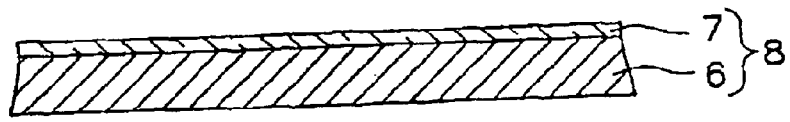

Referring to FIG. 2B, an unshrinkable green ceramic sheet 7 for suppressing shrinkage is provided on the green functional ceramic sheet 6 to define a green ceramic sheet composite 8. The unshrinkable green ceramic sheet 7 includes a ceramic material that does not sinter at a sintering temperature of the functional ceramic material included in the functional ceramic layer 2 and functions as the support layer 3 for preventing the shrinkage of the functional ceramic layer 2. An exemplary ceramic material that does not sinter at the sintering temperature for the functional ceramic material is powdered alumina.

The unshrinkable green ceramic sheet 7 may include a plurality of green ceramic layers. The green ceramic sheet composite 8 is defined by providing a green functional ceramic sheet 6 on an unshrinkable green ceramic sheet 7. Alternatively, in order to prepare a green ceramic sheet, a support layer for suppressing the shrinkage may be provided on a green functional ceramic sheet via a thick-film printing process, or a green functional ceramic sheet may be provided on a support layer for preventing shrinkage via a thick-film printing process.

Figure 2C:

Referring to FIG. 2C, a copper thin-film conductor 10 is provided on a substrate film 9 defined by polyester or other suitable substrate film by a plating process.

Figure 2D:
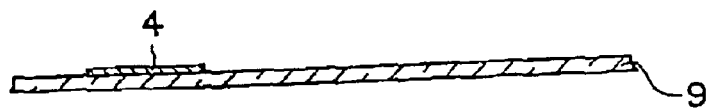

Referring to FIG. 2D, the thin-film conductor 10 is etched by a dry or wet etching process to form a first conductor pattern 4 for an inductor electrode or a signal line.

Figure 2E:
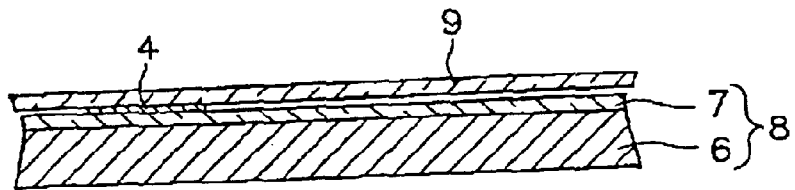
Figure 2F:
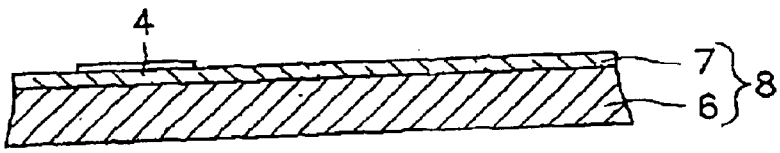

Referring to FIG. 2E, the substrate film 9 is overlaid on the green ceramic sheet composite 8 such that the unshrinkable green ceramic sheet 7 is in contact with the first conductor pattern 4. Referring to FIG. 2F, the substrate film 9 is removed to transfer the first conductor pattern 4 from the substrate film 9 to a main surface of the green ceramic sheet composite 8.

Figure 2G:
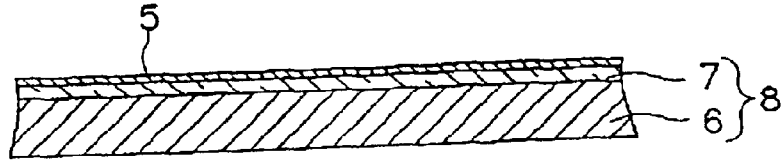

Referring to FIG. 2G, a pattern of conductive paste including powdered copper and an organic vehicle is formed on the unshrinkable green ceramic sheet 7 of the green ceramic sheet composite 8 by printing and is dried to form a second conductor pattern 5 that functions as a ground electrode on the unshrinkable green ceramic sheet 7 of the green ceramic sheet composite 8. The second conductor pattern 5 may be formed on the other main surface, namely, on the green functional ceramic sheet 6 of the green ceramic sheet composite 8.

A desired number of the green ceramic sheet composites 8 are stacked to define a green laminate. In the green laminate, unshrinkable green ceramic sheets 7 are each provided with the first or second conductor pattern 4 or 5 on the main surface thereof, as shown in FIGS. 2F and 2G.

The green laminate is fired at about 950° C. in an $N_2$—$H_2O$ atmosphere to form the monolithic ceramic substrate 1 shown in FIG. 1. The atmosphere and sintering temperature is determined depending on the functional ceramic material and the conductor.

In this firing step, the green functional ceramic sheets 6 and the second conductor patterns 5 are sintered, whereas the green unshrinkable ceramic sheets 7 are not substantially sintered due to the fact that the ceramic material that does not sinter at the sintering temperature for the functional ceramic material in the green ceramic sheet composites 8. The unsintered ceramic sheets 7 prevent the shrinkage along the main plane of the green functional ceramic sheets 6. The first and second conductor patterns 4 and 5 also do not shrink during the firing process and thus are highly precise.

Monolithic ceramic substrates were prepared according to the above method and properties thereof were measured.

Table 1 leads to the following conclusions:
(1) When the porosity of the first conductor pattern, i.e. thin-film conductor exceeds about 10%, cracking occurs in the fired thin-film conductor.
(2) When the area ratio of the thin-film conductor to the functional ceramic layer along the plane exceeds about 90%, cracking occurs in the fired monolithic ceramic substrate.
(3) When the thickness of the conductive paste for forming the second conductor pattern, i.e., the thick-film conductor exceeds about 30 $\mu$m, delamination of the thick-film conductor occurs due to a difference in density in the green laminate. The thickness of the thick-film conductor is preferably in the range of about 0.5 $\mu$m to about 20 $\mu$m.

In Samples 3 to 6 and 10 to 12, no cracking was observed in the thin-film conductor and the substrate and no delamination of the thick-film conductor was observed.

When the thickness of the thin-film conductor exceeds about 100 $\mu$m voids and cracks occur during the lamination process; hence, the thickness is preferably in the range of about 5 to about 35 $\mu$m.

If the volume resistivity of the metal conductor exceeds about 2.5 $\Omega$·cm, the conductive loss increases. If the surface roughness exceeds about 5 $\mu$m, the surface propagation loss of high-frequency waves increases.

In addition to the preferred embodiments described above, variations may be made without departing from the spirit and the scope of the present invention.

For example, in the monolithic ceramic substrate 1 shown in FIG. 1, the stacking order of the functional ceramic layers 2 and the support layers 3 can be appropriately changed. Two or more functional ceramic layers 2 may be stacked. In FIG. 1, an additional support layer may be provided under the lowermost functional ceramic layer 2 of the monolithic ceramic substrate 1.

When the stacking order of the functional ceramic layers 2 and the support layers 3 is changed, the locations of the first conductor patterns 4 and the second conductor patterns 5 can also be changed appropriately. In FIG. 1, the first conductor patterns 4 and the second conductor patterns 5 are disposed between the functional ceramic layers 2 and the support layers 3. When at least two functional ceramic layers 2 are provided, a first conductor pattern 4 or second conductor pattern 5 may be disposed in the interface between these functional ceramic layers 2. Alternatively, a first conductor pattern 4 or second conductor pattern 5 may be arranged on one outer surface of the monolithic ceramic substrate 1.

In the preferred embodiments described above, the first conductor pattern 4 is a thin-film conductor obtained by

| Sample | Porosity of Thin-Film Conductor (%) | Cracking of Thin-Film Conductor | Area Ratio of Thin-Film Conductor (%) | Cracking of Substrate | Thickness of Sintered Thick-Film Conductor ($\mu$m) | Delamination of Thick-Film Conductor |
|---|---|---|---|---|---|---|
| 1 | 20 | Observed | 50 | Not observed | 15 | Not observed |
| 2 | 15 | Observed | 50 | Not observed | 15 | Not observed |
| 3 | 10 | Not observed | 50 | Not observed | 15 | Not observed |
| 4 | 2 | Not observed | 50 | Not observed | 15 | Not observed |
| 5 | 5 | Not observed | 75 | Not observed | 15 | Not observed |
| 6 | 5 | Not observed | 90 | Not observed | 15 | Not observed |
| 7 | 5 | Not observed | 95 | Observed | 15 | Not observed |
| 8 | 5 | Not observed | 95 | Observed | 15 | Not observed |
| 9 | 5 | Not observed | 70 | Not observed | 0.3 | Observed |
| 10 | 3 | Not observed | 70 | Not observed | 0.5 | Not observed |
| 11 | 3 | Not observed | 70 | Not observed | 15 | Not observed |
| 12 | 1 | Not observed | 70 | Not observed | 30 | Not observed |
| 13 | 5 | Not observed | 70 | Not observed | 35 | Observed | etching of a metal foil. Alternatively, the first conductor pattern 4 may be formed by laser processing or mechanical punching of a metal foil. Alternatively, the first conductor pattern 4 may be formed by bending a metal wire into a desired circuit pattern. Alternatively, the first conductor pattern 4 may be a thin-film conductor formed by an additive plating process or vapor evaporation process.

When manufacturing the monolithic ceramic substrate, a first or second conductor pattern may be formed on one main surface of each of green functional ceramic sheets, before these green functional ceramic sheets are stacked. In such a case, the first and second conductor patterns are provided, and then the green functional ceramic sheets and the support layers are stacked to form the green sheet composite. In this process, each support layer may be arranged on both main surfaces, i.e., on the main surface provided with the first or second conductive pattern and on the other main surface not provided with the conductive pattern. In this modification, a plurality of the green sheet composites is stacked to form a green laminate.

In the green laminate, two green ceramic sheets that function as the support layers are preferably provided only above the uppermost layer and below the lowermost layer such that these support layers are removed after sintering.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. A monolithic ceramic substrate comprising:
   at least three functional ceramic layers including a functional ceramic material;
   at plurality of support layers including a ceramic material that does not sinter at a sintering temperature for the functional ceramic material, respective ones of the plurality of support layers being disposed on both sides of each of the at least three functional ceramic layers to prevent shrinkage of the at least three functional ceramic layers;
   a first conductor pattern including at least one thin-film conductor selected from the group consisting of a metal foil, a metal wire, and a conductive thin-film, the first conductor pattern being in contact with at least one of the at least three functional ceramic layers; and
   a second conductor pattern including a thick-film conductor in contact with at least one of the at least three functional ceramic layers.

2. The monolithic ceramic substrate according to claim 1 wherein at least one of the plurality of support layers is disposed between an adjacent pair of the at least three functional ceramic layers.

3. The monolithic ceramic substrate according to claim 2, wherein the first conductor pattern and the second conductor pattern are each disposed between one of the at least three functional ceramic layers and one of the plurality of support layers.

4. The monolithic ceramic substrate according to claim 1, wherein the thin-film conductor of the first conductor pattern has a thickness of about 100 µm or less.

5. The monolithic ceramic substrate according to claim 1, wherein the thin-film conductor of the first conductor pattern has a porosity of about 10% or less before sintering of the at least three functional ceramic layers.

6. The monolithic ceramic substrate according to claim 1, wherein the thin-film conductor of the first conductor pattern has a volume resistivity of about 2.5 Ω·cm or less and a surface roughness of about 5 µm or less.

7. The monolithic ceramic substrate according to claim 1 wherein an area ratio of the thin-film conductor of the first conductor pattern relative to the at least three functional ceramic layers is about 90% or less.

8. The monolithic ceramic substrate according to claim 1, wherein the second conductor pattern is made of a conductive paste and has a thickness of about 30 µm or less after sintering of the at least three functional ceramic layers.

9. The monolithic ceramic substrate according to claim 1, wherein the first conductor pattern defines at least one of an inductor electrode and a signal line.

10. The monolithic ceramic substrate according to claim 9, wherein the area ratio of the thin-film conductor relative to the at least three functional ceramic layers is about 30% or less.

11. The monolithic ceramic substrate according to claim 1, wherein the second conductor pattern defines a ground electrode.

12. The monolithic ceramic substrate according to claim 11, wherein the area of the second conductor pattern is at least about 50% of the area of the at least three functional ceramic layers.

* * * * *